United States Patent [19]

Fazan et al.

[11] Patent Number: 5,278,091
[45] Date of Patent: Jan. 11, 1994

[54] PROCESS TO MANUFACTURE CROWN STACKED CAPACITOR STRUCTURES WITH HSG-RUGGED POLYSILICON ON ALL SIDES OF THE STORAGE NODE

[75] Inventors: Pierre Fazan; Viju Mathews, both of Boise, Id.

[73] Assignee: Micron Semiconductor, Inc., Boise, Id.

[21] Appl. No.: 58,554

[22] Filed: May 4, 1993

[51] Int. Cl.[5] .......................................... H01L 21/70
[52] U.S. Cl. ...................... 437/52; 437/47; 437/60; 437/235; 437/977
[58] Field of Search .............. 437/47, 48, 52, 60, 437/228, 233, 235, 919, 977; 251/309

[56] References Cited

U.S. PATENT DOCUMENTS

| | | | |
|---|---|---|---|
| 5,126,280 | 6/1992 | Cham et al. | 437/52 |
| 5,150,276 | 9/1992 | Gonzalez et al. | 437/52 |
| 5,162,248 | 11/1992 | Dennison et al. | 437/52 |
| 5,185,282 | 2/1993 | Lee et al. | 437/52 |
| 5,229,314 | 7/1993 | Okudaria et al. | 437/52 |

FOREIGN PATENT DOCUMENTS

| | | | |
|---|---|---|---|
| 0074752 | 3/1989 | Japan | 437/919 |
| 0091957 | 4/1991 | Japan | 437/52 |
| 3230561 | 10/1991 | Japan | 437/52 |

OTHER PUBLICATIONS

"A Stacked Capacitor Cell with Ring Structure" by N. Shinmure et al., pp. 833–836. Central Research Laboratories, Sharp Corporation, Tenri, Nara 632, Japan.
"Crown-Shaped Stacked-Capacitor Cell for 1.5-V Operation 64-Mb DRAM's" by T. Kaga et al., pp. 255-261 1991 IEEE.

Primary Examiner—Tom Thomas
Attorney, Agent, or Firm—David J. Paul

[57] ABSTRACT

The present invention develops a container capacitor by forming a first insulative layer over conductive word lines; forming an opening between neighboring conductive word lines; forming a conductive plug between neighboring parallel conductive word lines; forming a planarized blanketing second insulating layer over the first insulative layer and the conductive plug; forming an opening into the second insulating layer, the opening thereby forming a container shape; forming a conductive spacer adjacent the wall of the container form, the conductive spacer having inner and outer surfaces; removing the second insulating layer, thereby exposing the outer surface of the conductive spacer; forming a layer of hemispherical grained conductive material superjacent the inner and outer surfaces of the conductive spacer; forming insulating spacers adjacent the inner and outer surfaces of the hemispherical grained conductive material; patterning the hemispherical grained conductive material to form a separate conductive container structure serving as a first capacitor cell plate; removing the insulating spacers; forming a capacitor cell dielectric layer adjacent and coextensive the conductive container structure and the first insulating layer; and forming a second conductive layer superjacent and coextensive the capacitor cell dielectric layer, the second conductive layer forming a second capacitor cell plate. The process of the present invention can be further modified to form a DRAM double container capacitor storage cell.

40 Claims, 6 Drawing Sheets

PROCESS TO MANUFACTURE CROWN STACKED CAPACITOR STRUCTURES WITH HSG-RUGGED POLYSILICON ON ALL SIDES OF THE STORAGE NODE

FIELD OF THE INVENTION

This invention relates to semiconductor circuit memory storage devices and more particularly to a process for fabricating three-dimensional stacked capacitor structures that may be used in such storage devices as high-density dynamic random access memories (DRAMs).

BACKGROUND OF THE INVENTION

In dynamic semiconductor memory storage devices it is essential that storage node capacitor cell plates be large enough to retain an adequate charge (or capacitance) in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A paper submitted by N. Shinmura, et al., entitled "A Stacked Capacitor Cell with Ring Structure," Extended Abstracts of the 22nd International Conference on Solid State Devices and Materials, 1990, pp. 833-836, discusses a 3-dimensional stacked capacitor incorporating a ring structure around the main electrode to effectively double the capacitance of a conventional stacked capacitor.

The ring structure and its development is shown in FIGS. 1(c) through 1(g), pp. 834 of the article mentioned above. FIG. 1(a), on the same page shows a bird's eye-view of storage electrodes. The storage node is formed by two polysilicon layers that form a core electrode encircled by a ring structure. Capacitor dielectric film surrounds the whole surface of the storage node electrode and then is covered with a third polysilicon layer to form the top capacitor electrode and completes the storage cell. This design can be fabricated using current methods and increases storage capacitance by as much as 200%.

Also, in a paper submitted by T. Kaga, et al., entitled "Crown-Shaped Stacked-Capacitor Cell for 1.5V Operation 64-Mb DRAM's," IEEE Transactions on Electron Devices. VOL. 38, NO. 2, February 2, 1991, pp. 255-261, discusses a self-aligned stacked-capacitor cell for 64-Mb DRAM's, called a CROWN cell. The CROWN cell and its development are shown in FIGS. 7(d) through 7(f), pp. 258 of this article. The crown shaped storage electrode is formed over word and bit lines and separated by a oxide/nitride insulating layer with the top insulating layer being removed to form the crown shape. Capacitor dielectric film surrounds the whole surface of the storage node electrode and the top capacitor electrode is formed to complete the storage cell.

U.S. Pat. No. 5,162,248, having the same assignee as does the present invention, is a related process to form a container cell. All publications cited herein are hereby incorporated by reference.

The present invention develops an existing stacked capacitor fabrication process to construct and optimize a three-dimensional container (crown or double crown) stacked capacitor cell. The capacitor's bottom plate (or storage node plate) is centered over a buried contact (or node contact) connected to an access transistor's diffusion area. The method presented herein provides fabrication uniformity and repeatability of the three-dimensional container cell.

SUMMARY OF THE INVENTION

The invention is directed to maximizing storage cell surface area in a high density/high volume DRAM (dynamic random access memory) fabrication process. An existing capacitor fabrication process is modified to construct a three-dimensional stacked container capacitor. The capacitor design of the present invention defines a stacked capacitor storage cell that is used in a DRAM process, however it will be evident to one skilled in the art to incorporate these steps into other processes requiring volatile memory cells, such as VRAMs or the like.

A first embodiment of the present invention develops a process for fabricating a conductive container structure on a starting substrate, with the process comprising the steps of:

a) forming a first insulating layer over parallel conductive lines;

b) forming an opening through the first insulating layer between neighboring parallel conductive lines;

c) forming a conductive plug between the neighboring parallel conductive lines;

d) forming a planarized blanketing second insulating layer over the first insulative layer and the conductive plug;

e) forming an opening into the second insulating layer, the opening thereby forming a container shape;

f) forming a conductive spacer adjacent the wall of the container form, the conductive spacer having inner and outer surfaces;

g) removing the second insulating layer thereby exposing the outer surface of the conductive spacer;

h) forming a layer of hemispherical grained conductive material superjacent the inner and outer surfaces of the conductive spacer;
i) forming insulating spacers adjacent the inner and outer surfaces of the hemispherical grained conductive material;
j) patterning the hemispherical grained conductive material to form a separate conductive container structure;
k) removing the insulating spacers;
l) forming a third insulating layer adjacent and coextensive the conductive container structure and the first insulating layer; and
m) forming a second conductive layer superjacent and coextensive the third insulating layer.

A second embodiment of the present invention develops a process for fabricating a conductive double container structure on a starting substrate, the process comprising the steps of:
a) forming a first insulating layer over parallel conductive lines;
b) forming an opening through the first insulating layer between neighboring parallel conductive lines;
c) forming a conductive plug between the neighboring parallel conductive lines;
d) forming a planarized blanketing second insulating layer over the first insulative layer and the conductive plug;
e) forming an opening into the second insulating layer, the opening thereby forming a container shape;
f) forming a conformal conductive layer adjacent the wall of the container form;
g) forming a third insulating layer;
h) removing portions of the third insulating layer and the conductive layer such that the conductive layer is separated into L-shaped structures, the L-shaped conductive structures having inner and outer surfaces with vertical insulating spacers adjacent the inner portions of the L-shaped structures;
i) forming a conductive plug between the insulating spacers, the conductive plug making contact to the L-shaped structures and the first conductive plug;
j) removing the insulating spacers and the second insulating layer, thereby exposing the inner and outer surfaces of the L-shaped structures;
k) forming a layer of hemispherical grained conductive material superjacent the inner and outer surfaces of the L-shaped structures;
l) forming insulating spacers adjacent the inner and outer surfaces of the hemispherical grained conductive material;
m) patterning the hemispherical grained conductive material to form a separate conductive double container structure;
n) removing the insulating spacers;
o) forming a third insulating layer adjacent and coextensive the conductive double container structure and the first insulating layer; and
p) forming a second conductive layer superjacent and coextensive the third insulating layer.

DETAILED DESCRIPTION OF THE PRESENT INVENTION

The present invention is directed to maximizing storage cell surface area, as well as providing uniform and repeatable, defect free, storage cell structures across a given substrate, in a high density/high volume DRAM fabrication process.

Figure 1:
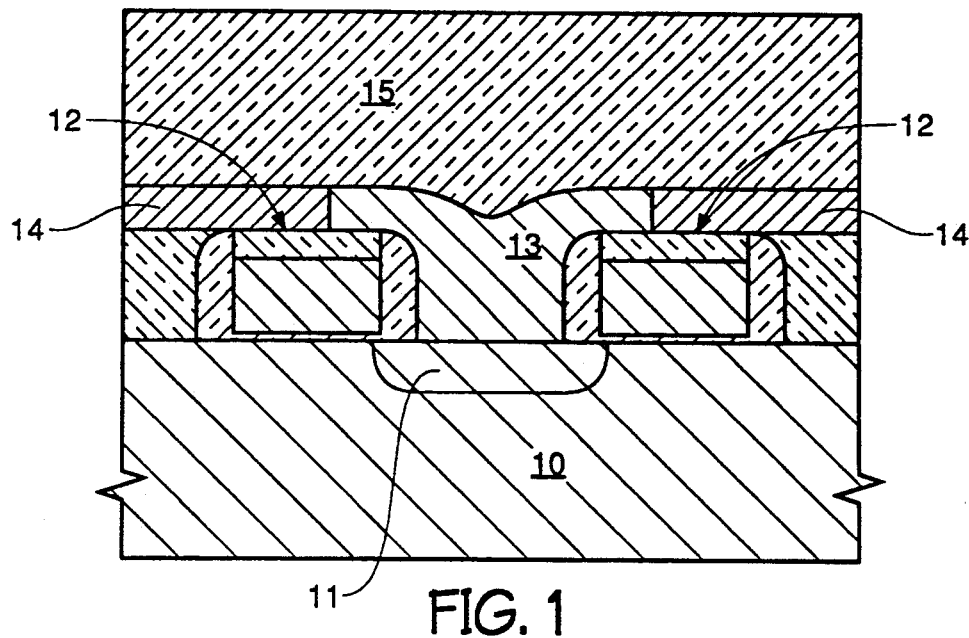
FIG. 1 is a composite cross-sectional view of an in-process wafer portion depicting the beginning steps of the present invention, whereby a polysilicon plug has been formed between two word lines which is then followed a deposition of nitride followed by a planarized layer of oxide.
Figure 2:
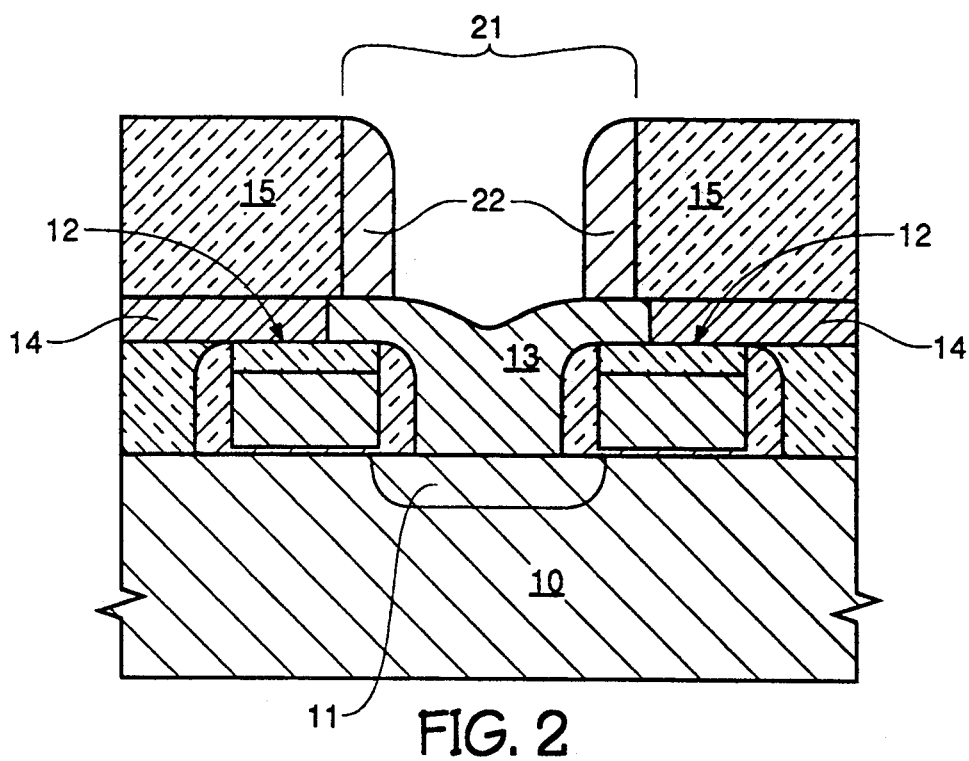
FIG. 2 is a cross-sectional view of the in-process wafer portion of FIG. 1 after a contact opening exposing the poly plug which is followed by the formation of doped polysilicon spacers.

As shown in FIG. 1, a silicon wafer is prepared using conventional process steps to form a conductively doped poly plug 13 residing between neighboring word lines 12 and making contact to diffusion region 11 of substrate 10. Silicon nitride layer 14 insulates word lines 12 and planarize silicon oxide 15 blankets nitride 14 and poly plug 13. The wafer has been processed up to the point of processing an array of storage cell capacitors. Capacitor cell fabrication will now follow.

The storage capacitor of each memory cell will make contact to the underlying diffusion region 11 via poly plug 13. Each underlying diffusion region 11 will have two storage node connections isolated from a single digit line contact by access transistors formed by poly word lines 12 crossing the active area. Normally each diffusion region 11 within the array is isolated from another by a thick field oxide. The diffusion areas can be arranged in interdigitated columns and non-interdigitated rows or simply parallel and in line to one another in both the vertical and horizontal directions. As previously mentioned, the diffusion areas are used to form active field effect transistors (FETS serving as access transistors to each individual capacitor) that can be doped as NMOS or PMOS type FETs depending on the desired use.

A preferred embodiment is depicted in FIGS. 2-6 in view of the in process steps of FIG. 1. Now referring to FIG. 2, the thickness of planarized oxide layer 15 depends on the height that is desired for the poly container structure yet to be formed. The height of the resulting poly structure will be one of the factors in determining the resulting capacitor plate surface area desired. A contact opening 21 is etched into oxide 15 thereby allowing access to the underlying poly plug 13. Contact opening 21 not only allows access to the underlying topography but also provides form for a subsequently placed layer of conductively doped thin poly. This thin poly layer is now formed, preferably by CVD, and then etched, thereby forming poly spacers 22 adjacent the patterned edges of oxide 15. Poly spacers 22 may either have been deposited insitu doped or it may be subsequently doped.

Figure 3:
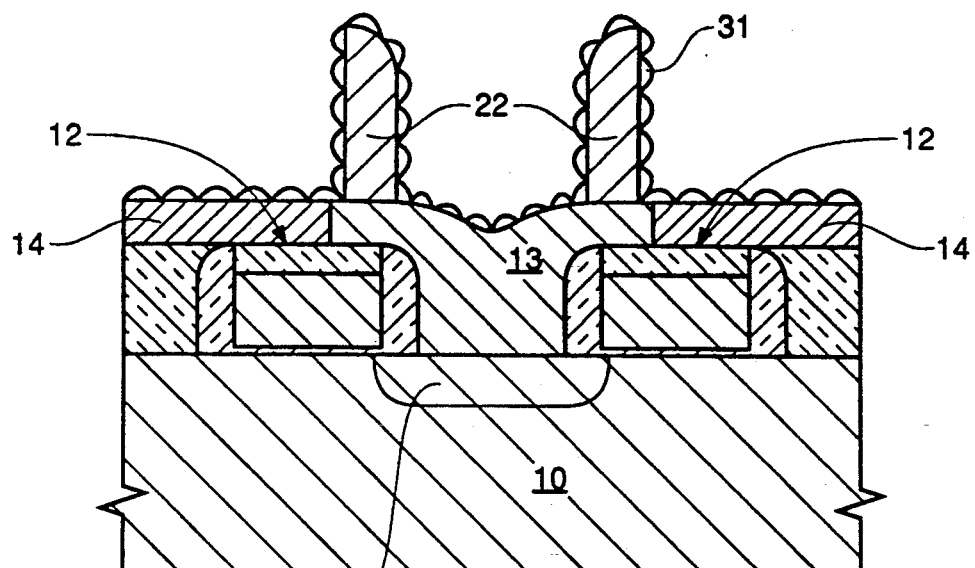
FIG. 3 is a cross-sectional view of the in-process wafer portion of FIG. 2 after a oxide wet etch followed by deposition of HSG poly.

Referring now to FIG. 3, oxide 15 is removed by an oxide wet etch thereby exposing the outer surface area of poly 22 which is followed by deposition of conductively doped hemispherical grain poly 31 (HSG poly).

Figure 4:
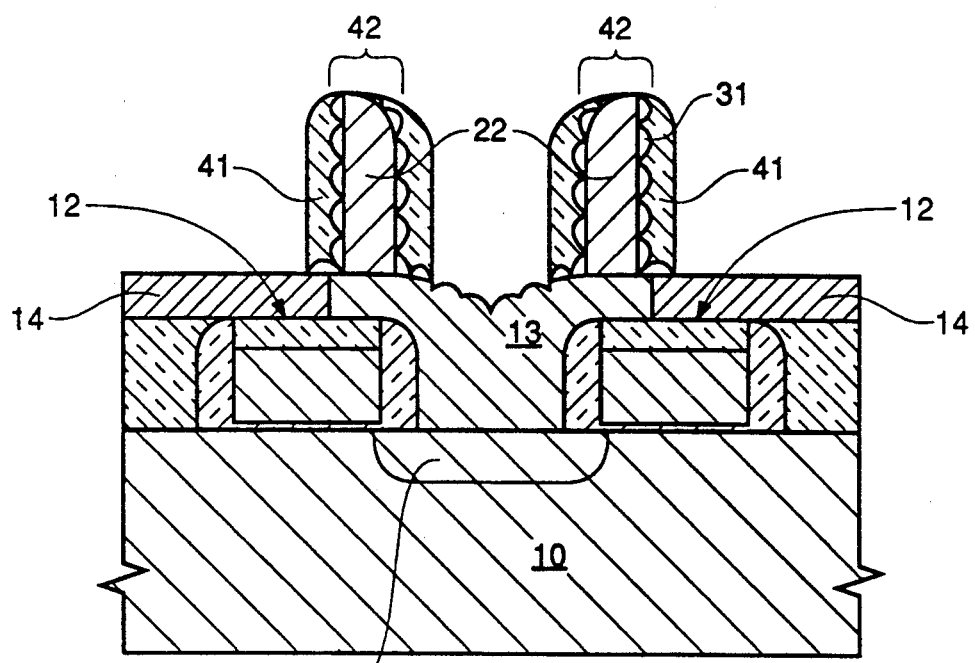
FIG. 4 is a cross-sectional view of the in-process wafer portion of FIG. 3 following the formation of oxide spacers and patterning of individual storage nodes.

Referring now to FIG. 4, a silicon oxide layer is deposited and a spacer etch is performed to form silicon oxide spacers 41 that cover and protect HSG poly 31 from a subsequent poly storage node patterning dry etch. The presence of oxide spacers 41 allow for HSG poly 31 to remain intact which will help significantly to increase capacitance.

Figure 5:
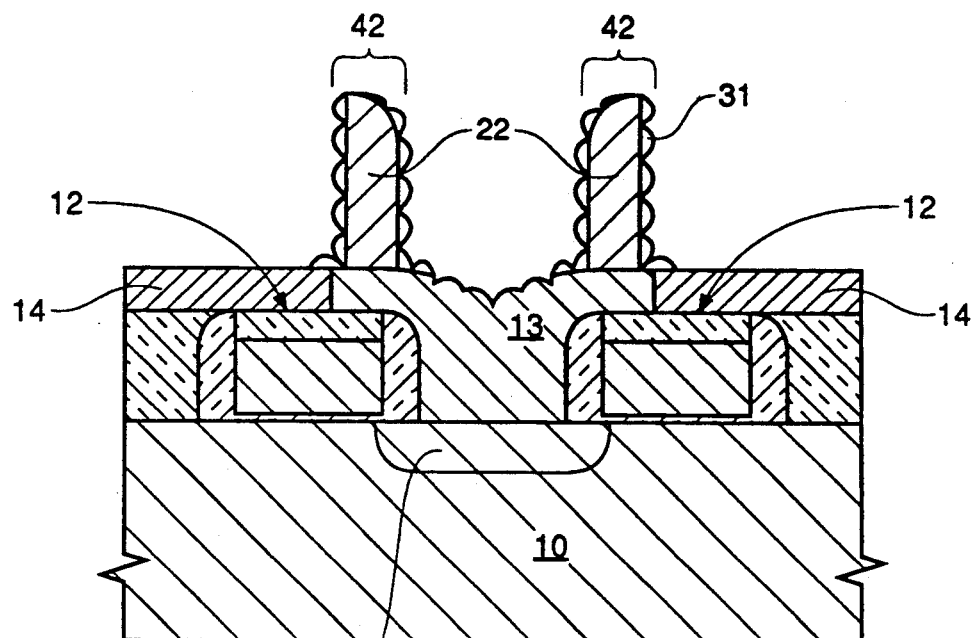
FIG. 5 is a cross-sectional view of the in-process wafer portion of FIG. 4 following the removal of the oxide spacers of FIG. 4.

Referring now to FIG. 5, the exposed portions of poly 31 are removed to separate neighboring poly structures, thereby forming individual containers 42, comprising poly plug 13 and doped poly spacers 22, with their respective exposed surfaces being coated with HSG doped poly 31.

Figure 6:
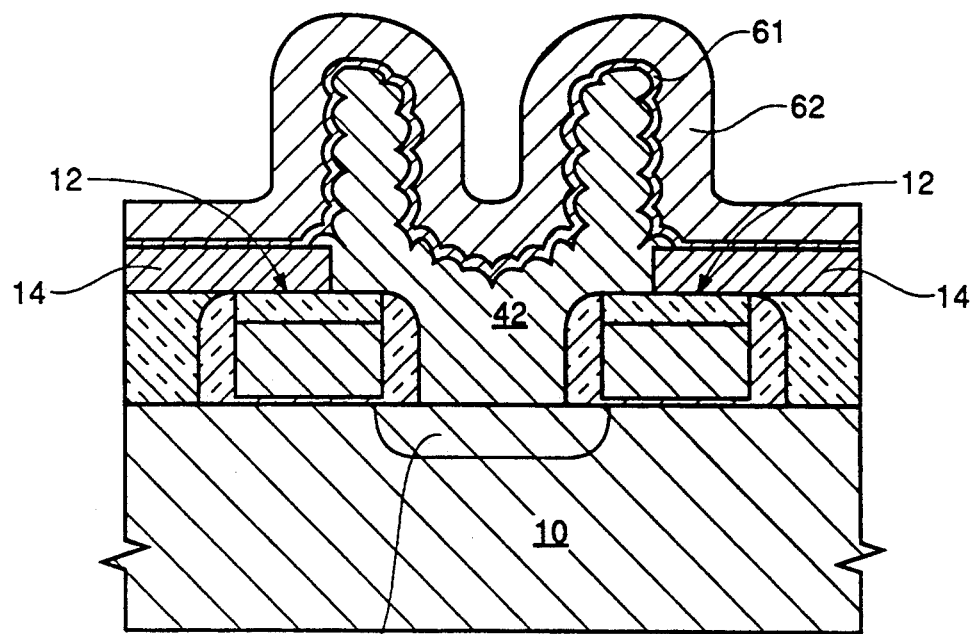
FIG. 6 is a cross-sectional view of the in-process wafer portion FIG. 5 following the formation of conformal cell dielectric and polysilicon, respectively.
Figure 7:
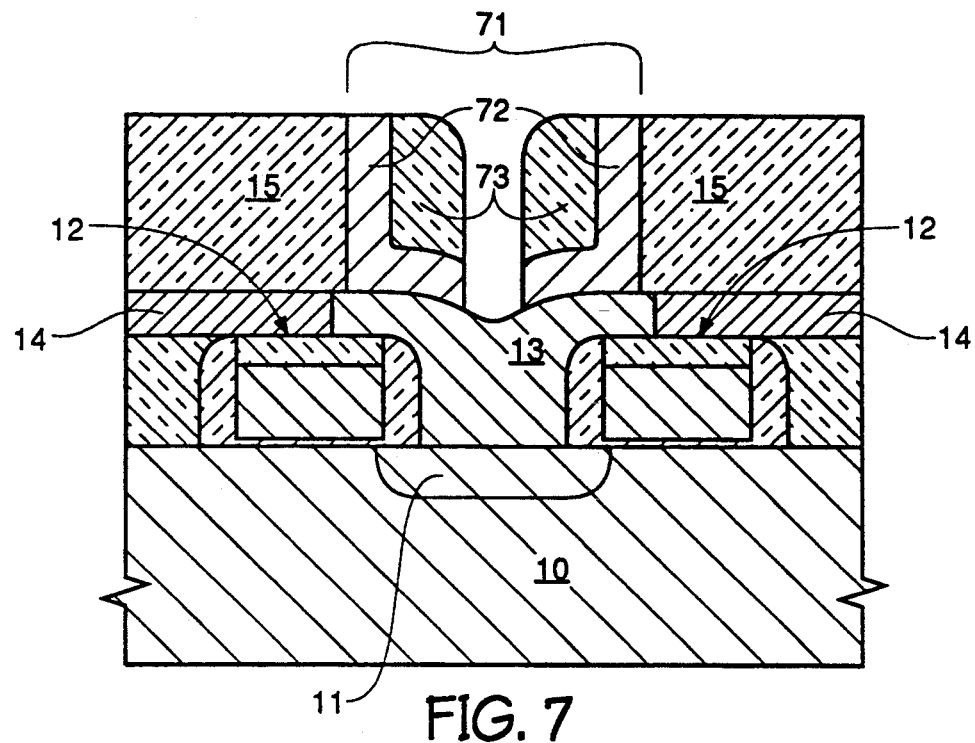
FIG. 7 is a cross-sectional view of the in-process wafer portion of FIG. 1 after a contact opening exposing the poly plug which is followed by the formation of doped polysilicon spacers and oxide spacers.

Referring now to FIG. 6, when using the individual containers 42 (of FIG. 5) to form a capacitor storage node plate contain®r 42, the remaining portion of nitride 14 is coated with a capacitor cell dielectric 61. Finally, a doped conformal poly layer 62 is placed to blanket cell dielectric 61 and serves as a common capacitor cell plate to the entire array of containers 42. From this point on the wafer is completed using conventional fabrication process steps.

An alternate embodiment is depicted in FIGS. 7-12 in view of the in-process steps completed in FIG. 1. Now referring to FIG. 7, the thickness of planarized oxide layer 15 depends on the height that is desired for the poly container structure yet to be formed. The height of the resulting poly structure will be one of the factors in determining the resulting capacitor plate surface area desired. A contact opening 71 is etched into silicon oxide 15 thereby allowing access to the underlying poly plug 13. Contact opening 71 not only allows access to the underlying topography but also provides a form for a subsequently placed layer of conductively doped thin poly. Next, silicon oxide is deposited which is followed by a dry etchback that forms oxide spacers 73 and L-shaped patterned poly liners 72 adjacent the patterned edges of oxide 15. This dry etchback also leaves a gap between oxide spacers 73 and exposes a middle portion of poly plug 13.

Figure 8:
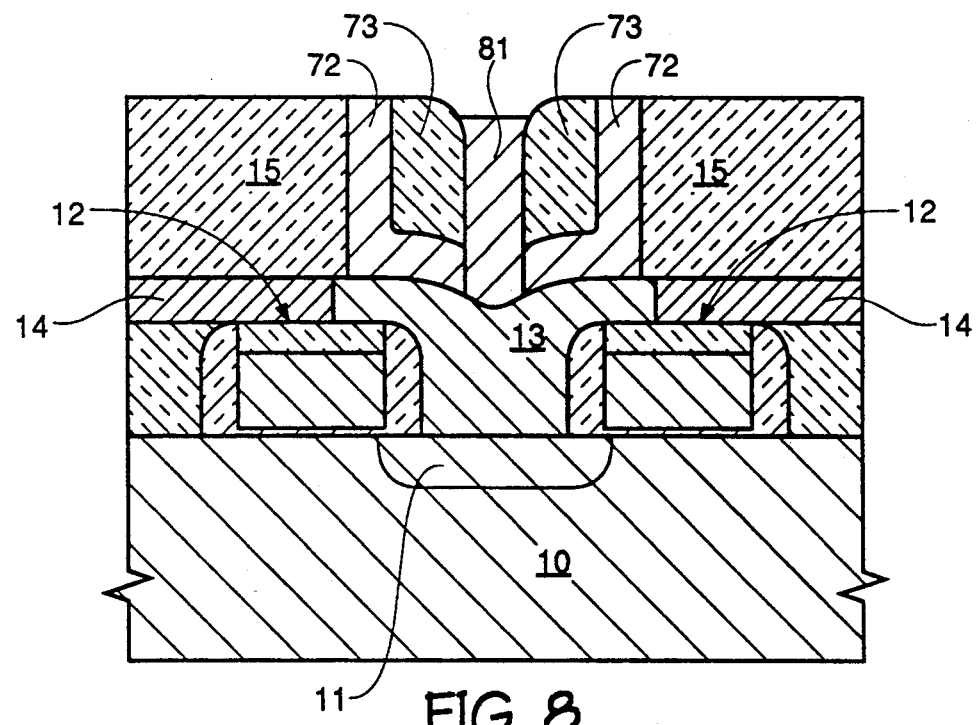
FIG. 8 is a cross-sectional view of the in-process wafer portion of FIG. 7 after formation of a doped polysilicon plug between the oxide spacers of FIG. 7.

Referring now to FIG. 8, a second poly plug 81 is formed by depositing a doped poly layer that is then etched back below the upper surface of spacers 73. A dry etchback satisfactorily accomplishes this etch step.

Figure 9:
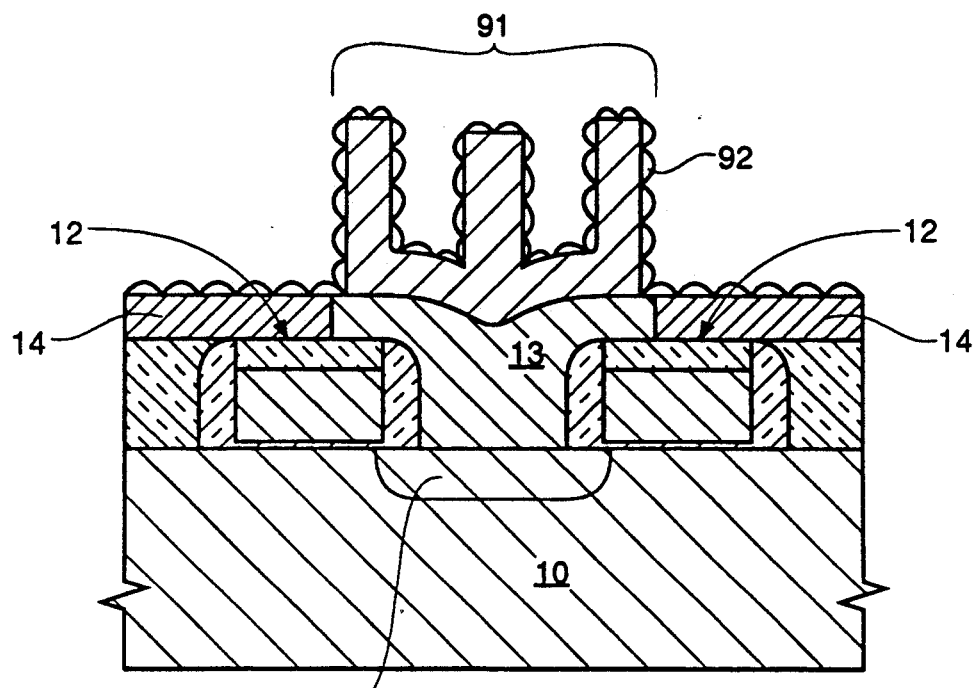
FIG. 9 is a cross-sectional view of the in-process wafer portion of FIG. 8 after a oxide wet etch followed by deposition of HSG poly.

Referring now to FIG. 9, oxide spacers 73 and planarized oxide 15 are removed by an oxide wet etch thereby exposing the inner and outer surface area of poly 71 and poly plug 81 to form a double crown structure 91 (also referred to as a poly plug crown structure or a double container cell). This step is then followed by a deposition of conductively doped hemi-spherical grain poly 92 (HSG poly) to coat the exposed surfaces of double crown structure 91.

Figure 10:
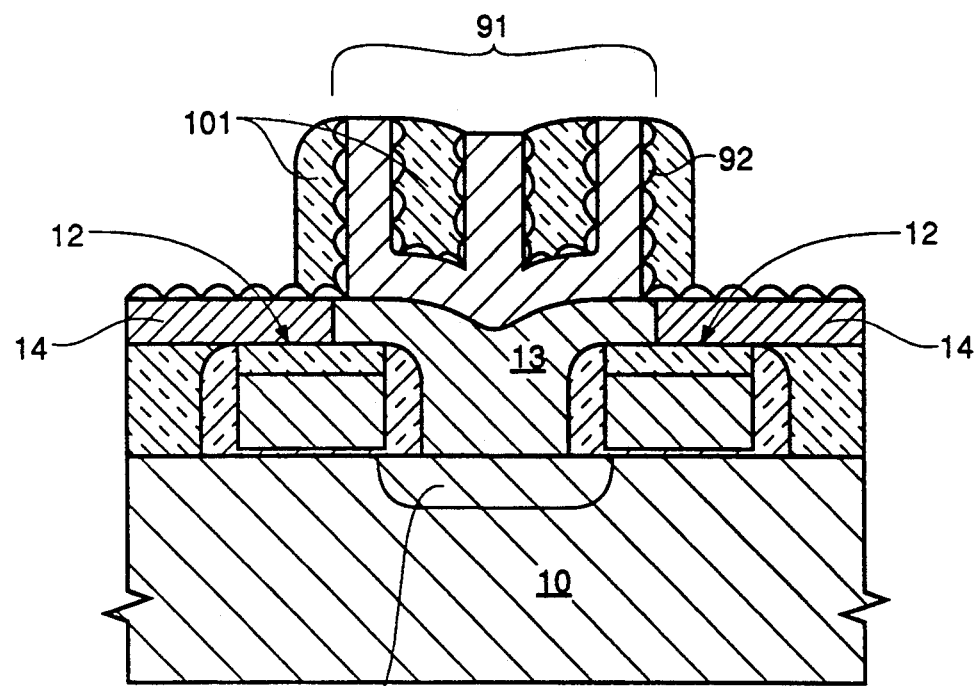
FIG. 10 is a cross-sectional view of the in-process wafer portion of FIG. 9 following the formation of oxide spacers and patterning of individual storage nodes.

Referring now to FIG. 10, a silicon oxide layer is deposited and a spacer etch is perfomred to form silicon oxide spacers 101 to cover and protect HSG poly 92 from a subsequent poly storage node patterning dry etch. The presence of oxide spacers 101 allow for HSG poly 92 to remain intact which will help to increase capacitance significantly.

Figure 11:
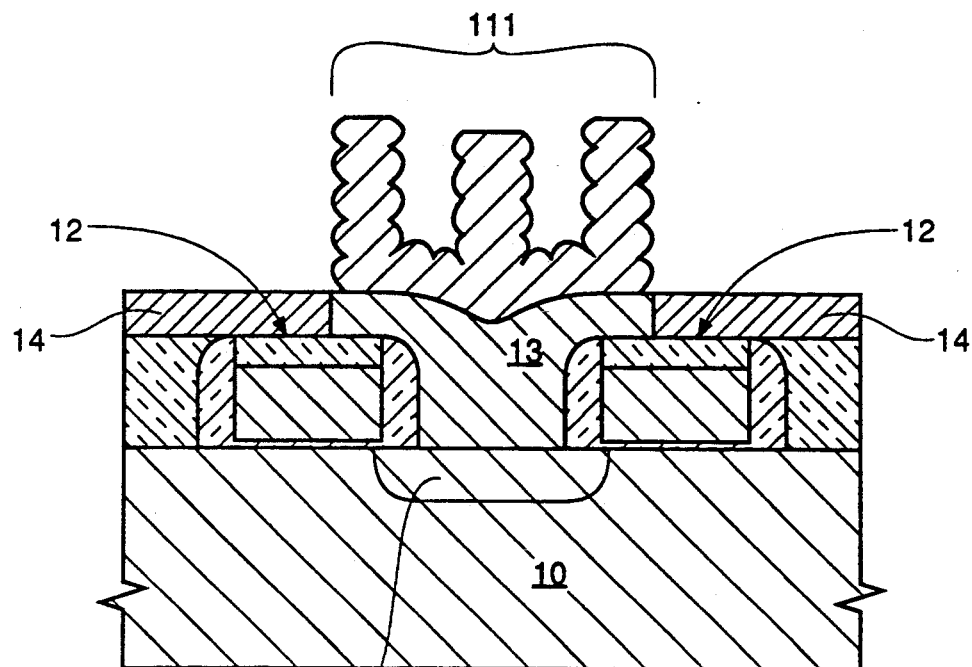
FIG. 11 is a cross-sectional view of the in-process wafer portion of FIG. 10 following the removal of the oxide spacers of FIG. 10.

Referring now to FIG. 11, the exposed portion of poly 92 are removed to separate neighboring poly structures, thereby forming an individual container 111 comprising doped poly plug 13 and doped L-shaped poly liners 72 which are both covered by HSG doped poly 92.

Figure 12:
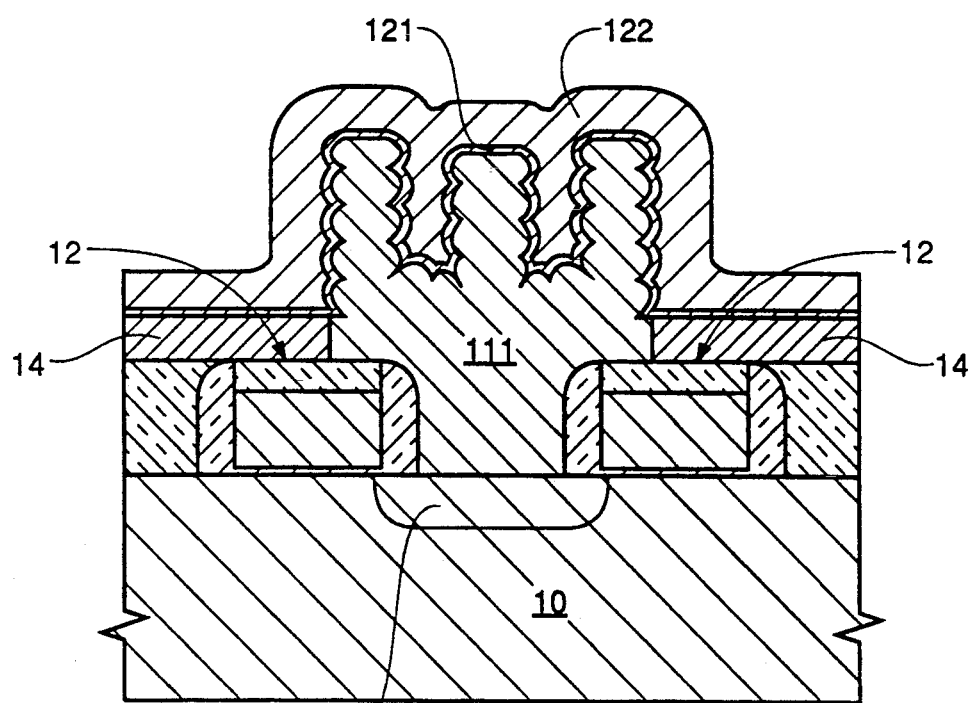
FIG. 12 is a cross-sectional view of the in-process wafer portion FIG. 11 following the formation of conformal cell dielectric and polysilicon, respectively.

Referring now to FIG. 12, when using this structure to form a capacitor storage node plate container 111 and the remaining portion of nitride 14 is coated with a capacitor cell dielectric 121. And, finally a doped conformal poly layer 122 is placed to blanket cell dielectric 121 and serves as a common capacitor cell plate to the entire array of containers 111. From this point on the wafer is completed using conventional fabrication process steps.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a conductive container structure on a starting substrate, said process comprising the steps of:
   a) forming a first insulating layer over parallel conductive lines;
   b) forming an opening through said first insulating layer between neighboring parallel conductive lines;
   c) forming a conductive plug between said neighboring parallel conductive lines;
   d) forming a planarized blanketing second insulating layer over said first insulative layer and said conductive plug;
   e) forming an opening into said second insulating layer, said opening thereby forming a container shape;
   f) forming a conductive spacer adjacent the wall of said container form, said conductive spacer having inner and outer surfaces;
   g) removing said second insulating layer thereby exposing said outer surface of said conductive spacer;
   h) forming a layer of hemispherical grained conductive material superjacent said inner and outer surfaces of said conductive spacer;

i) forming insulating spacers adjacent the inner and outer surfaces of said hemispherical grained conductive material;

j) patterning said hemispherical grained conductive material to form a separate conductive container structure;

k) removing said insulating spacers;

l) forming a third insulating layer adjacent and coextensive said conductive container structure and said first insulating layer; and m) forming a second conductive layer superjacent and coextensive said third insulating layer.

2. A process as recited in claim 1, wherein said conductive plug comprises conductively doped polysilicon.

3. A process as recited in claim 1, wherein said first insulating layer is silicon nitride.

4. A process as recited in claim 1, wherein said second insulating layer is silicon oxide.

5. A process as recited in claim 1, wherein said conductive spacer comprises conductively doped polysilicon.

6. A process as recited in claim 1, wherein said hemispherical grained conductive material comprises conductively doped hemispherical grained polysilicon.

7. A process as recited in claim 1, wherein said insulating spacers are silicon oxide.

8. A process as recited in claim 1, wherein said third insulating layer is silicon nitride.

9. A process as recited in claim 1, wherein said second conductive layer comprises conductively doped polysilicon.

10. A process for fabricating a conductive double container structure on a starting substrate, said process comprising the steps of:

a) forming a first insulating layer over parallel conductive lines;

b) forming an opening through said first insulating layer between neighboring parallel conductive lines;

c) forming a conductive plug between said neighboring parallel conductive lines;

d) forming a planarized blanketing second insulating layer over said first insulative layer and said conductive plug;

e) forming an opening into said second insulating layer, said opening thereby forming a container shape;

f) forming a conformal conductive layer adjacent the wall of said container form;

g) forming a third insulating layer;

h) removing portions of said third insulating layer and said conductive layer such that said conductive layer is separated into L-shaped structures, said L-shaped conductive structures having inner and outer surfaces with vertical insulating spacers adjacent the inner portions of said L-shaped structures;

i) forming a conductive plug between said insulating spacers, said conductive plug making contact to said L-shaped structures and said first conductive plug;

j) removing said insulating spacers and said second insulating layer, thereby exposing said inner and outer surfaces of said L-shaped structures k) forming a layer of hemispherical grained conductive material superjacent said inner and outer surfaces of said L-shaped structures;

l) forming insulating spacers adjacent the inner and outer surfaces of said hemispherical grained conductive material;

m) patterning said hemispherical grained conductive material to form a separate conductive double container structure;

n) removing said insulating spacers;

o) forming a third insulating layer adjacent and coextensive said conductive double container structure and said first insulating layer; and p) forming a second conductive layer superjacent and coextensive said third insulating layer 11. A process as recited in claim 10, wherein said first conductive plug comprises conductively doped polysilicon.

12. A process as recited in claim 10, wherein said first insulating layer is silicon nitride.

13. A process as recited in claim 10, wherein said second insulating layer is silicon oxide.

14. A process as recited in claim 10, wherein said conformal conductive layer comprises conductively doped polysilicon.

15. A process as recited in claim 10, wherein said third insulating layer is silicon oxide.

16. A process as recited in claim 10, wherein said second conductive plug comprises conductively doped polysilicon.

17. A process as recited in claim 10, wherein said hemispherical grained conductive material comprises conductively doped hemispherical grained polysilicon.

18. A process as recited in claim 10, wherein said insulating spacers are silicon oxide.

19. A process as recited in claim 10, wherein said third insulating layer is silicon nitride.

20. A process as recited in claim 10, wherein said second conductive layer comprises conductively doped polysilicon.

21. A process for fabricating a DRAM container storage capacitor on a silicon substrate having active areas, word lines and digit lines, said process comprising the steps of:

a) forming a first insulating layer over parallel conductive lines;

b) forming an opening through said first insulating layer between neighboring parallel conductive lines;

c) forming a conductive plug between said neighboring parallel conductive word lines;

d) forming a planarized blanketing second insulating layer over said first insulative layer and said conductive plug;

e) forming an opening into said second insulating layer, said opening thereby forming a container shape;

f) forming a conductive spacer adjacent the wall of said container form, said conductive spacer having inner and outer surfaces;

g) removing said second insulating layer, thereby exposing said outer surface of said conductive spacer;

h) forming a layer of hemispherical grained conductive material superjacent said inner and outer surfaces of said conductive spacer;

i) forming insulating spacers adjacent the inner and outer surfaces of said hemispherical grained conductive material;

j) patterning said hemispherical grained conductive material to form a separate conductive container structure serving as a first capacitor cell plate;

k) removing said insulating spacers;

l) forming a capacitor cell dielectric layer adjacent and coextensive said conductive container structure and said first insulating layer; and m) forming a second conductive layer superjacent and coextensive said capacitor cell dielectric layer, said second conductive layer forming a second capacitor cell plate.

22. A process as recited in claim 21, wherein said conductive plug comprises conductively doped polysilicon.

23. A process as recited in .claim 21, wherein said first insulating layer is silicon nitride.

24. A process as recited in claim 21, wherein said second insulating layer is silicon oxide.

25. A process as recited in claim 21, wherein said conductive spacer comprises conductively doped polysilicon.

26. A process as recited in claim 21, wherein said hemispherical grained conductive material comprises conductively doped hemispherical grained polysilicon.

27. A process as recited in claim 21, wherein said insulating spacers are silicon oxide.

28. A process as recited in claim 21, wherein said third insulating layer is silicon nitride.

29. A process as recited in claim 21, wherein said second conductive layer comprises conductively doped polysilicon.

30. A process for fabricating a DRAM double container storage capacitor on a silicon substrate having active areas, word lines and digit lines, said process comprising the steps of:

a) forming a first insulating layer over parallel conductive lines;

b) forming an opening through said first insulating layer between neighboring parallel conductive lines;

c) forming a conductive plug between said neighboring parallel conductive word lines;

d) forming a planarized blanketing second insulating layer over said first insulative layer and said conductive plug;

e) forming an opening into said second insulating layer, said opening thereby forming a container shape;

f) forming a conformal conductive layer adjacent the wall of said container form;

g) forming a third insulating layer;

h) etching said third insulating layer and said conductive layer such that said conductive layer is separated into L-shaped structures, said L-shaped conductive structures having inner and outer surfaces with vertical insulating spacers adjacent the inner portions of said L-shaped structures;

i) forming a conductive plug between said insulating spacers, said conductive plug making contact to said L-shaped structures and said first conductive plug;

j) removing said insulating spacers and said second insulating layer, thereby exposing said inner and outer surfaces of said L-shaped structures;

k) forming a layer of hemispherical grained conductive material superjacent said inner and outer surfaces of said L-shaped structures;

l) forming insulating spacers adjacent the inner and outer surfaces of said hemispherical grained conductive material;

m) patterning said hemispherical grained conductive material to form a separate conductive double container structure serving as a first capacitor cell plate;

n) removing said insulating spacers;

o) forming a capacitor cell dielectric layer adjacent and coextensive said conductive double container structure and said first insulating layer; and p) forming a second conductive layer superjacent and coextensive said capacitor cell dielectric layer, said second conductive layer forming a second capacitor cell plate.

31. A process as recited in claim 30, wherein said first conductive plug comprises conductively doped polysilicon.

32. A process as recited in claim 30, wherein said first insulating layer is silicon nitride.

33. A process as recited in claim 30, wherein said second insulating layer is silicon oxide.

34. A process as recited in claim 30, wherein said conformal conductive layer comprises conductively doped polysilicon.

35. A process as recited in claim 30, wherein said third insulating layer is silicon oxide.

36. A process as recited in claim 30, wherein said second conductive plug comprises conductively doped polysilicon.

37. A process as recited in claim 30, wherein said hemispherical grained conductive material comprises conductively doped hemispherical grained polysilicon.

38. A process as recited, in claim 30, wherein said insulating spacers are silicon oxide.

39. A process as recited in claim 30, wherein said third insulating layer is silicon nitride.

40. A process as recited in claim 30, wherein said second conductive layer comprises conductively doped polysilicon.

* * * * *